(12) United States Patent
Hwang et al.

(10) Patent No.: US 9,917,276 B2
(45) Date of Patent: Mar. 13, 2018

(54) DISPLAY DEVICE

(71) Applicant: SAMSUNG DISPLAY CO., LTD., Yongin-si, Gyeonggi-do (KR)

(72) Inventors: Hyeondeuk Hwang, Cheonan-si (KR); Soyeon Joo, Asan-si (KR); Hayoung Choi, Cheongju-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/206,108

(22) Filed: Jul. 8, 2016

(65) Prior Publication Data

US 2017/0125726 A1    May 4, 2017

(30) Foreign Application Priority Data

Oct. 29, 2015  (KR) ........................ 10-2015-0151351

(51) Int. Cl.

| G02F 1/133 | (2006.01) |
|---|---|
| H01L 51/52 | (2006.01) |
| G02F 1/1362 | (2006.01) |
| G02F 1/1368 | (2006.01) |
| G02F 1/1333 | (2006.01) |
| G02F 1/1335 | (2006.01) |

(52) U.S. Cl.
CPC ........ *H01L 51/5246* (2013.01); *G02F 1/1368* (2013.01); *G02F 1/13306* (2013.01); *G02F 1/136227* (2013.01); *G02F 1/13338* (2013.01); *G02F 1/133512* (2013.01); *G02F 1/133514* (2013.01); *G02F 2202/28* (2013.01)

(58) Field of Classification Search
CPC ............ H01L 51/5246; H01L 27/3244; H01L 51/5237; G02F 1/133306; G02F 1/136227; G02F 1/1368
See application file for complete search history.

(56) References Cited

U.S. PATENT DOCUMENTS

| 2002/0180923 | A1* | 12/2002 | Aoyagi | ................ G02B 6/0083 349/149 |
|---|---|---|---|---|
| 2009/0122250 | A1* | 5/2009 | Oohira | .................. G02F 1/1333 349/149 |
| 2009/0207367 | A1* | 8/2009 | Oohira | ................. H05K 1/0219 349/150 |
| 2011/0157762 | A1* | 6/2011 | Kurashima | ............. G06F 3/044 361/277 |
| 2013/0278553 | A1* | 10/2013 | Suzuki | .................... G06F 3/044 345/174 |

(Continued)

FOREIGN PATENT DOCUMENTS

| KR | 10-2007-0104172 A | 10/2007 |
|---|---|---|
| KR | 10-2008-0060517 A | 7/2008 |

(Continued)

*Primary Examiner* — James Dudek
(74) *Attorney, Agent, or Firm* — Lewis Roca Rothgerber Christie LLP

(57) ABSTRACT

A display device includes a driving circuit layer including a thin film transistor, a display layer at the driving circuit layer and overlapping a portion of the driving circuit layer, a window at the display layer, a first adhesive member between the driving circuit layer and the window, and a second adhesive member between the display layer and the window and spaced from the first adhesive member in a plane view.

20 Claims, 16 Drawing Sheets

(56) References Cited

U.S. PATENT DOCUMENTS

2014/0036166 A1* 2/2014 Kurasawa ........... G02F 1/13338
349/12
2014/0168580 A1* 6/2014 Huh .................... G02B 5/3033
349/96

FOREIGN PATENT DOCUMENTS

| KR | 10-2014-0102946 A | 8/2014 |
| KR | 10-2015-0004647 A | 1/2015 |
| KR | 10-2015-0043078 A | 4/2015 |
| KR | 10-2015-0051019 A | 5/2015 |
| KR | 10-2015-0087493 A | 7/2015 |
| KR | 10-2016-0030000 A | 3/2016 |

* cited by examiner

DISPLAY DEVICE

CROSS-REFERENCE TO RELATED APPLICATION

This application claims priority to, and the benefit of, Korean Patent Application No. 10-2015-0151351, filed on Oct. 29, 2015, the entire contents of which are incorporated herein by reference in their entirety.

BACKGROUND

1. Field

The present disclosure herein relates to display devices having improved durability.

2. Description of the Related Art

Recently, various types of display devices having reduced weight and volume have been developed. Display devices have been used for the purpose of displaying an image in various information processing apparatuses, such as TVs, monitors, notebooks, and mobile phones.

Currently known display devices may include liquid crystal displays (LCDs), plasma display panels (PDPs), organic light-emitting displays (OLEDs), field effect displays (FEDs), and electrophoretic displays (EPDs).

SUMMARY

The present disclosure provides a display device having improved durability.

According to an embodiment, a display device includes a driving circuit layer including a thin film transistor, a display layer at the driving circuit layer and overlapping a portion of the driving circuit layer, a window at the display layer, a first adhesive member between the driving circuit layer and the window, and a second adhesive member between the display layer and the window, and spaced from the first adhesive member in a plane view.

The first adhesive member may include a double-sided adhesive tape.

The first adhesive member may be thicker than the second adhesive member.

The first adhesive member may be spaced from the display layer in a plane view.

The driving circuit layer may further include a first substrate portion in contact with the display layer, a second substrate portion connected to the first substrate portion, and a third substrate portion connected to the second substrate portion and contacting the first adhesive member.

The second substrate portion may be between the display layer and the first adhesive member in a plane view.

A printed circuit board may be electrically connected to the driving circuit layer, and a tape carrier package may be connected to each of the driving circuit layer and the printed circuit board.

The tape carrier package may contact the third substrate portion.

The tape carrier package may be spaced from the first adhesive member.

The window may include a first window portion contacting the second adhesive member, a second window portion connected to the first window portion, and a third window portion connected to the second window portion, and contacting the first adhesive member.

The third substrate portion may overlap at least a portion of the third window portion.

The display layer may include an organic electroluminescent device or a liquid crystal layer.

The layer further may include at least one of a touch screen panel or an optical member.

The first adhesive member may include a first adhesive layer, a resin layer at the first adhesive layer, and a second adhesive layer at the resin layer.

The first adhesive member may include a first adhesive and an ultraviolet (UV) curing agent.

The first adhesive may include at least one of acrylic acid, 2-ethylhexyl acrylate, 2-methylbutyl acrylate, isooctyl acrylate, lauryl acrylate, ethyl acrylate, butyl acrylate, hexyl acrylate, octyl acrylate, decyl acrylate, isodecyl acrylate, an acrylic acid monomer, or 2,2'-azobisisobutyronitrile.

The UV curing agent may include at least one of aliphatic urethane acrylate, caprolactone acrylate, 1,6-hexanediol diacrylate, trimethylolpropane triacrylate, pentaerythritol triacrylate, lauryl acrylate, urethane acrylate, epoxy acrylate, polyester acrylate, or silicon acrylate.

The first adhesive member may further include a photoinitiator.

The photoinitiator may include at least one of benzoyl peroxide, acetyl peroxide, diauryl peroxide, hydrogen peroxide, potassium persulfonate, 2,2'-azobisisobutylinitrile, or hydroxy dimethyl acetophenone.

BRIEF DESCRIPTION OF THE DRAWINGS

The accompanying drawings are included to provide a further understanding of the inventive concept, and are incorporated in, and constitute a part of, this specification. The drawings illustrate embodiments of the inventive concept and, together with the description, serve to explain principles of the inventive concept. In the drawings.

DETAILED DESCRIPTION

Figure 1A:
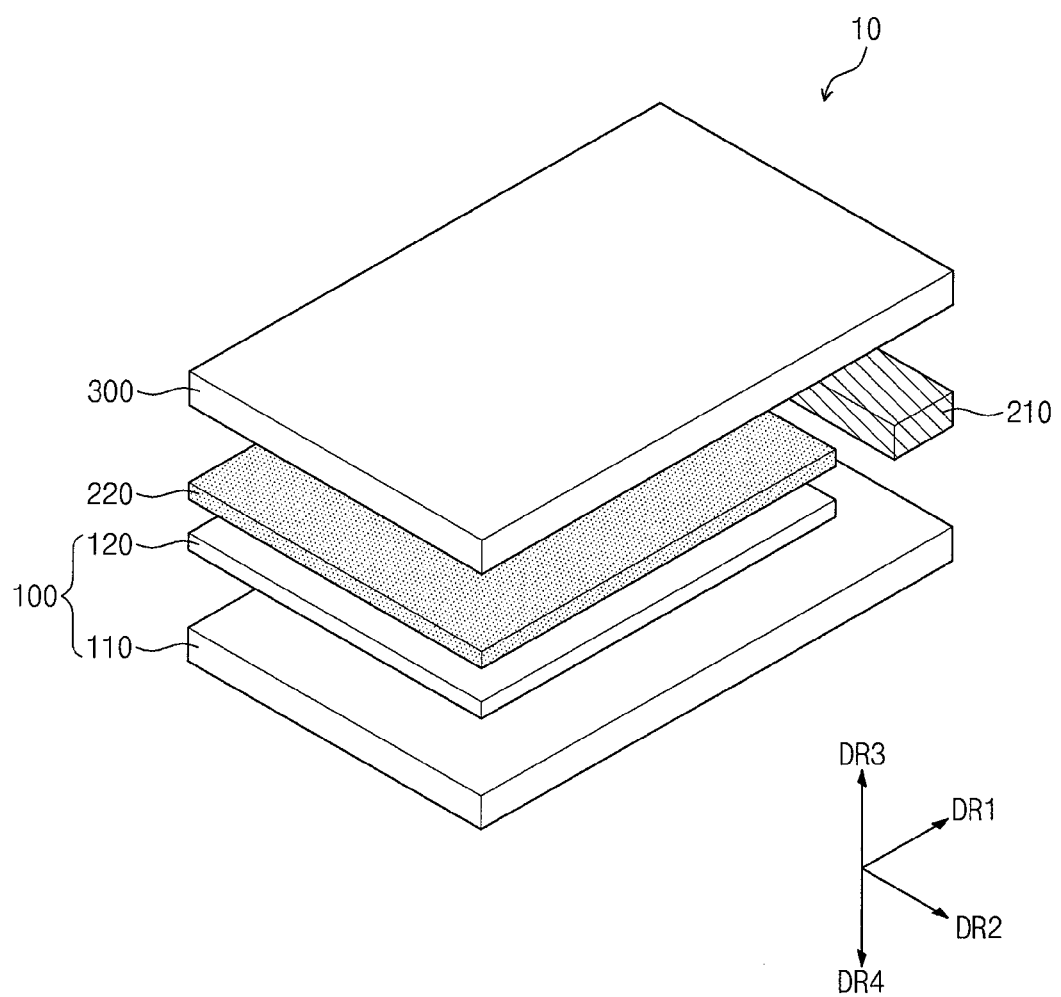
FIG. 1A is an exploded perspective view schematically illustrating a display device according to an embodiment.

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, a display device according to an embodiment will be described.

Figure 1B:
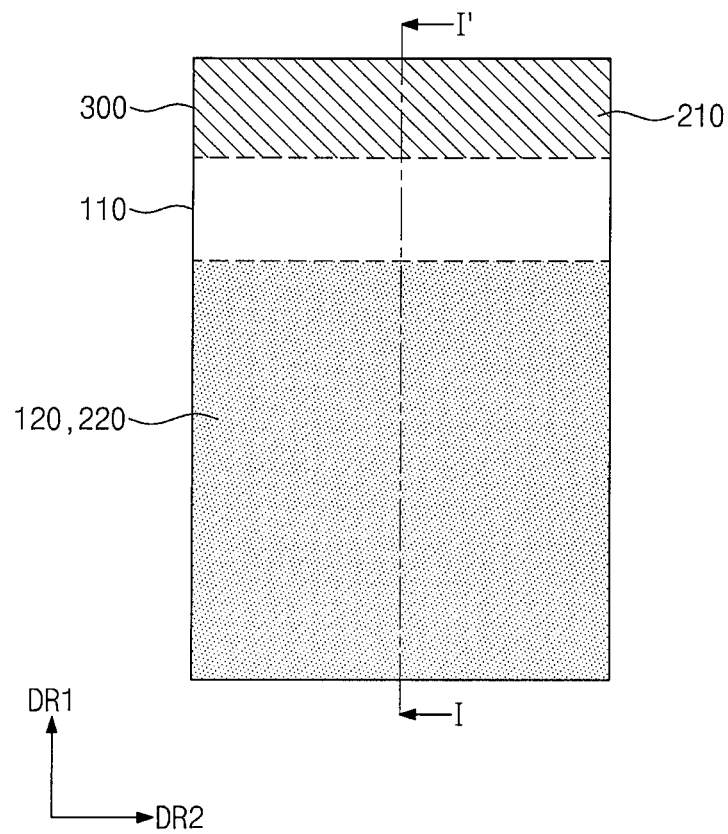
FIG. 1B is a schematic plan view corresponding to FIG. 1A.
Figure 1C:
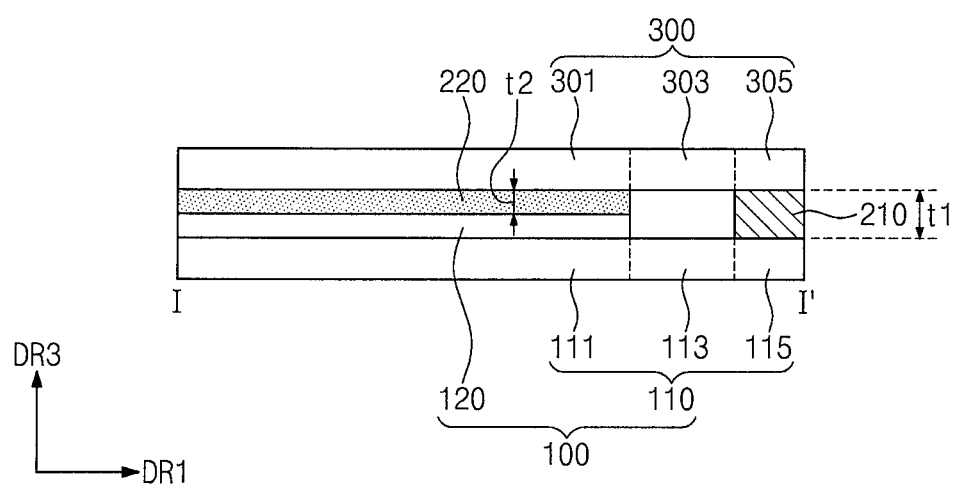
FIG. 1C is a schematic cross-sectional view taken along the line I-I' of FIG. 1B.
Figure 1D:
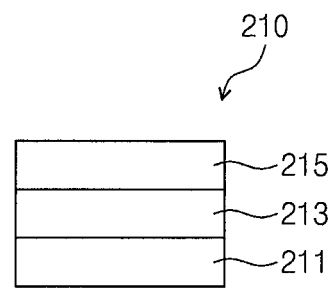
FIG. 1D is a schematic cross-sectional view illustrating a first adhesive member included in the display device according to an embodiment.

FIG. 1A is an exploded perspective view schematically illustrating the display device according to an embodiment, FIG. 1B is a schematic plan view corresponding to FIG. 1A, FIG. 1C is a schematic cross-sectional view taken along the line I-I' of FIG. 1B, and FIG. 1D is a schematic cross-sectional view illustrating a first adhesive member included in the display device according to an embodiment.

Referring to FIGS. 1A to 1D, a display device 10 according to an embodiment may include a display member 100, a window 300, a first adhesive member 210, and a second adhesive member 220.

The display member 100 may include a driving circuit layer 110 and a display layer/display panel/display surface 120. The driving circuit layer 110 and the display layer 120, as a non-limiting example, may be stacked in a third direction DR3 intersecting with a first direction DR1 and a second direction DR2. The display member 100 may be a display panel.

As a non-limiting example, the display panel may be selected from the group including a liquid crystal display panel, an organic light-emitting display panel, a plasma display panel, an electrophoretic display panel, a microelectromechanical system (MEMS) display panel, and an electrowetting display panel.

The display member 100 may include at least one of a touch screen panel and an optical member. As a non-limiting example, the touch screen panel may be a capacitive touch screen panel or a resistive touch screen panel. Also, the touch screen panel may be driven by a self cap method or a mutual cap method.

The optical member may include a polarizing plate. The polarizing plate may include a retardation plate. However, the inventive concept is not limited thereto. The optical member may omit a polarizing plate, and may instead include a color filter and a black matrix that may perform the function of the polarizing plate.

Figure 2A:
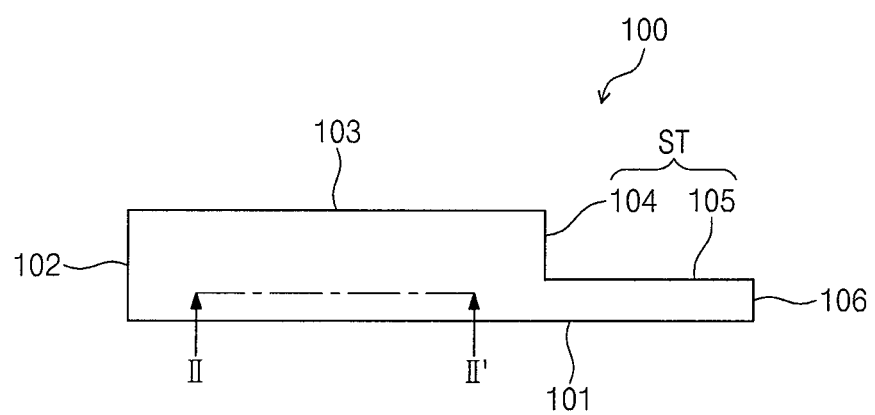
FIGS. 2A, 2B, 2C, and 2D are cross-sectional views schematically illustrating a display member included in the display device according to embodiments of the inventive concept.
Figure 2B:
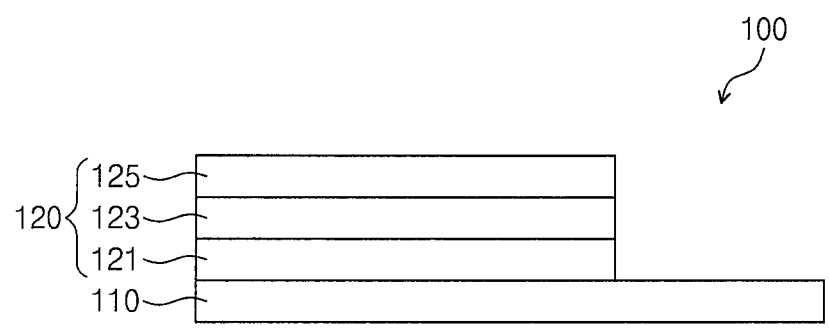
Figure 2C:
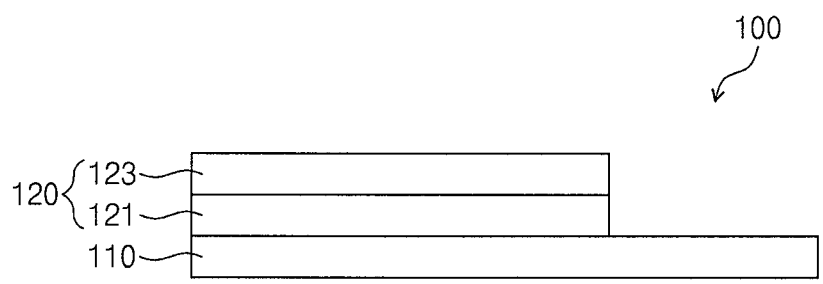
Figure 2D:
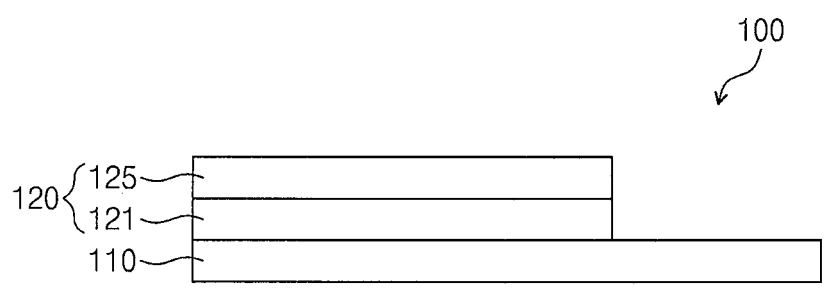
Figure 2E:
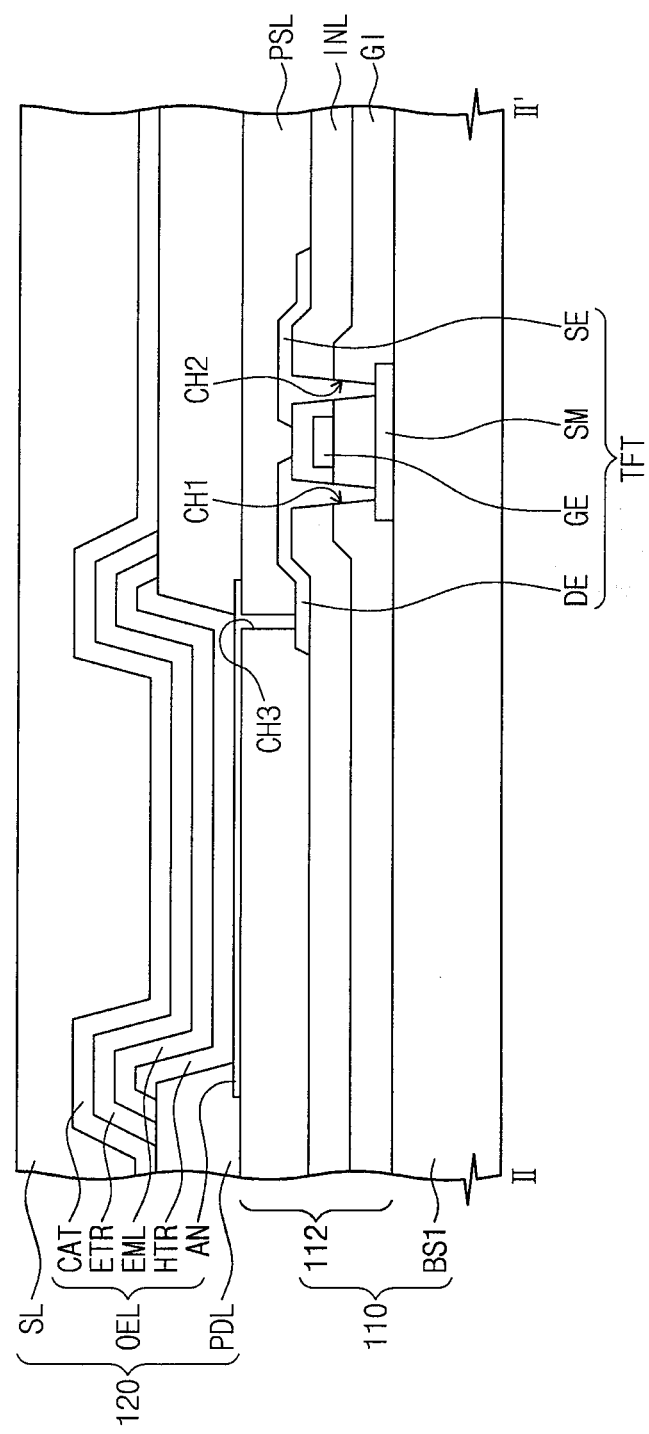
FIGS. 2E and 2F are schematic cross-sectional views taken along the line II-II' of FIG. 2A.
Figure 2F:
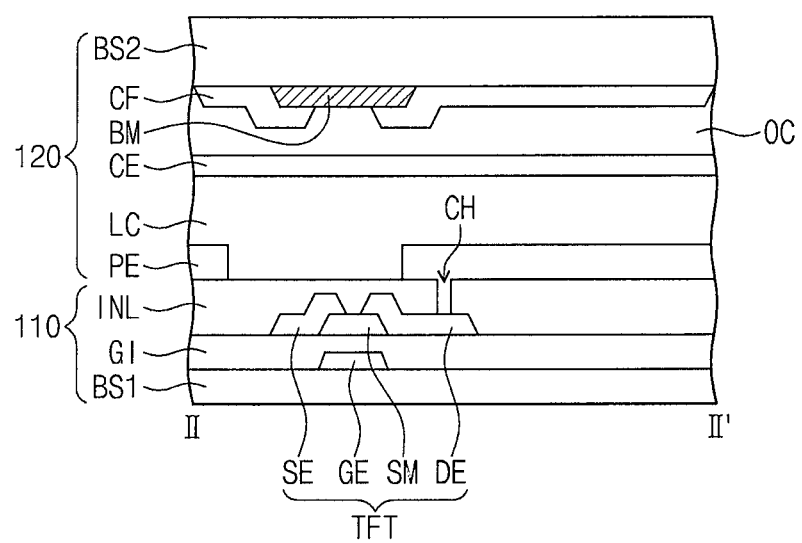

FIGS. 2A, 2B, 2C, and 2D are cross-sectional views schematically illustrating the display member included in the display device according to embodiments. FIGS. 2E and 2F are schematic cross-sectional views taken along the line II-II' of FIG. 2A.

Referring to FIGS. 1A to 1D and 2A, the display member 100 has a step ST. The display member 100 may include a first surface 101, a second surface 102, a third surface 103, a fourth surface 104, a fifth surface 105, and a sixth surface 106. The first surface 101 may be opposite to the third surface 103 and to the fifth surface 105. The second surface 102 may be opposite to each of the fourth surface 104 and the sixth surface 106. The second surface 102 may extend in a direction crossing the first surface 101. The third surface 103 may be connected to each of the second surface 102 and the fourth surface 104. The fourth surface 104 may be connected to each of the third surface 103 and the fifth surface 105. The fifth surface 105 may be connected to each of the fourth surface 104 and the sixth surface 106. The sixth surface 106 may be connected to each of the fifth surface 105 and the first surface 101. The step may be defined by the fourth surface 104 and the fifth surface 105. As shown in FIGS. 2B, 2C, and 2D, the fourth surface 104 may be one side of the display layer 120, and the fifth surface 105 may denote a surface, which does not overlap the display layer 120 in a plane view, at a top surface of the driving circuit layer 110. The expression "in a plane view" may denote a case where it is viewed in a fourth direction DR4.

Figure 3A:
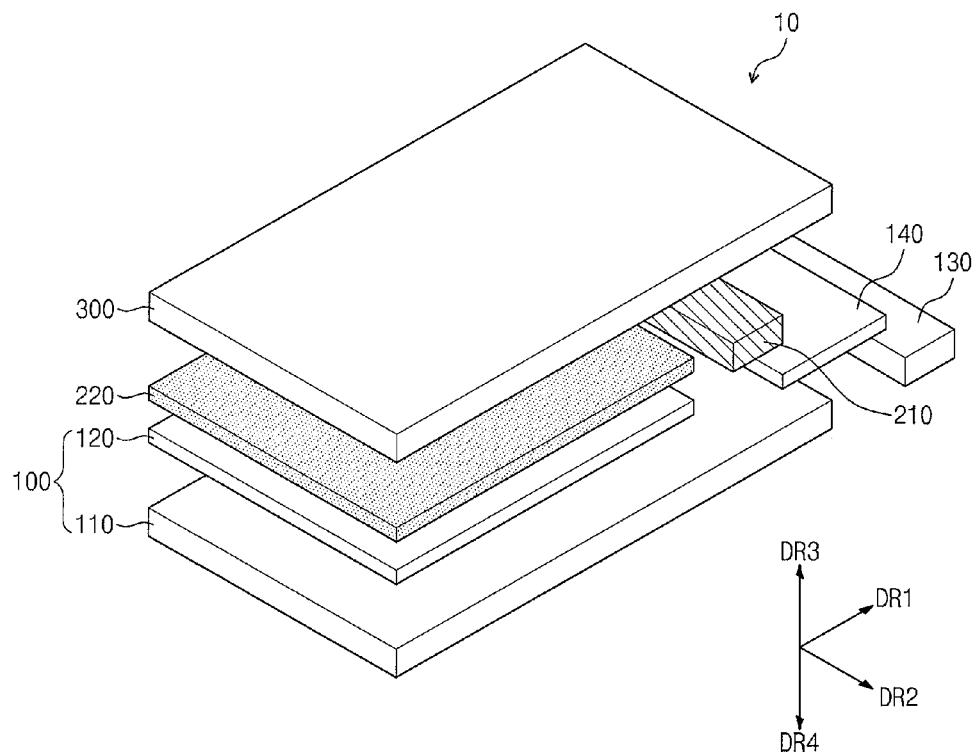
FIG. 3A is an exploded perspective view schematically illustrating the display device according to an embodiment.
Figure 3B:
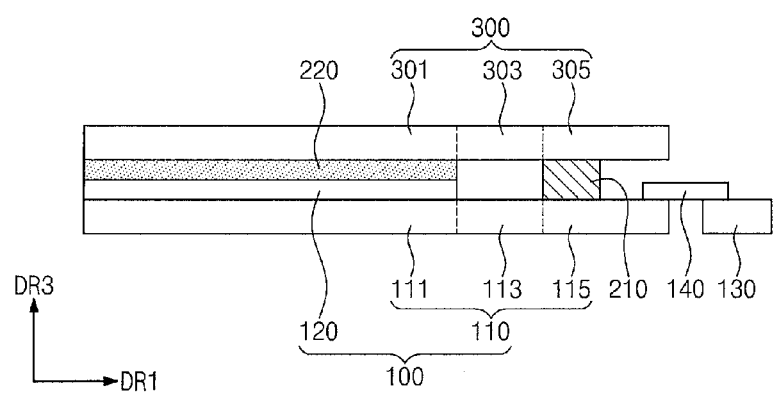
FIG. 3B is a schematic cross-sectional view corresponding to FIG. 3A.

As shown in FIG. 1C, the first adhesive member 210 may be provided to the step ST. As shown in FIGS. 3A and 3B, a tape carrier package 140, further discussed below, may be provided to the step ST.

Referring to FIGS. 2B, 2C, and 2D, the display layer 120 may include a display element layer 121. The display layer 120 may further include a touch screen panel 123 and/or an optical member 125.

Referring to FIG. 2B, the display layer 120 may include the display element layer 121, the touch screen panel 123, and the optical member 125. The touch screen panel 123 may be provided on the display element layer 121. The touch screen panel 123 may be bonded to the display element layer 121 by an adhesive member, or may be in contact with the display element layer 121 without the adhesive member. As a non-limiting example, the touch screen panel 123 may be provided in contact with an encapsulation substrate or an encapsulation layer (e.g., SL of FIG. 2E) included in the display layer 120. The optical member 125 may be provided on the touch screen panel 123. The optical member 125 may include a polarizing plate. The optical member 125 may omit the polarizing plate, and may include a color filter and a black matrix which may perform the function of the polarizing plate. The optical member 125 may be bonded to the touch screen panel 123 by an adhesive member, or may be in contact with the touch screen panel 123 without the adhesive member.

Referring to FIG. 2C, the display layer 120 includes the display element layer 121 and the touch screen panel 123. The touch screen panel 123 may be provided at the display element layer 121.

Referring to FIG. 2D, the display layer 120 may include the display element layer 121 and the optical member 125. The optical member 125 may be provided on the display element layer 121.

Referring to FIGS. 1A to 1D, 2A, and 2E, the display member 100 may include an organic light-emitting display panel.

The driving circuit layer 110 may include a first base substrate BS1 and a circuit layer 112. The circuit layer 112 may include a conductive pattern and a circuit insulating layer. The conductive pattern may include a gate line, a data line, and a thin film transistor TFT. The circuit insulating layer may include a gate insulating layer GI, an insulation layer INL, a passivation layer PSL, and a pixel-defining layer PDL.

The first base substrate BS1 may be a plastic substrate, a glass substrate, a quartz substrate, or a polymer substrate. The first base substrate BS1 may be a transparent insulating substrate. The gate line and the data line may be at the first base substrate BS1.

The thin film transistor TFT may be provided at the first base substrate BS1. The thin film transistor TFT may include a semiconductor pattern SM, a gate electrode GE, a source electrode SE, and a drain electrode DE.

The semiconductor pattern SM may be provided at the first base substrate BS1. The gate insulating layer GI may be provided at the semiconductor pattern SM. The gate insulating layer GI may be provided at an entire surface of the first base substrate BS1, and may cover the semiconductor pattern SM.

The gate electrode GE may be provided at the gate insulating layer GI. The gate electrode GE may be provided at, or above, the semiconductor pattern SM, with the gate insulating layer GI therebetween, so that some areas of the gate electrode GE may overlap the semiconductor pattern SM. The gate electrode GE may be formed of a metal. The gate electrode GE may be composed of a plurality of layers. For example, the gate electrode GE may be formed of nickel, chromium, molybdenum, aluminum, titanium, copper, tungsten, and/or an alloy containing these metals.

The insulation layer INL may be provided at, or above, the gate electrode GE. The insulation layer INL may cover the gate electrode GE. The insulation layer INL may be a single layer, or may be a plurality of layers. The insulation layer INL may include at least one layer of an organic layer, an inorganic layer, and/or a hybrid layer in which an organic material and an inorganic material are mixed.

The drain electrode DE and the source electrode SE may be provided at the insulation layer INL. The drain electrode DE may be in contact with the semiconductor pattern SM through a first contact hole CH1. The source electrode SE may be in contact with the semiconductor pattern SM through a second contact hole CH2.

The passivation layer PSL may be provided on the drain electrode DE and the source electrode SE. The passivation layer PSL may perform the function of a protective layer configured to protect the thin film transistor TFT, and may also perform the function of a planarization layer configured to planarize a top surface of the thin film transistor TFT.

An anode AN may be provided at the passivation layer PSL. The anode AN, as a non-limiting example, may instead be a cathode. The anode AN may be connected to the drain electrode DE through a third contact hole CH3, which may be provided in the passivation layer PSL.

The pixel-defining layer PDL, which may be configured to partition an emission layer EML to correspond to one of pixels PX, may be provided at the passivation layer PSL. The pixel-defining layer PDL may expose a top surface of the anode AN.

The display layer 120 may include an organic electroluminescent device OEL. The organic electroluminescent device OEL may be at an area adjacent, or surrounded by, the pixel-defining layer PDL. The organic electroluminescent device OEL may include the anode AN, a hole transport region HTR, the emission layer EML, an electron transport region ETR, and a cathode CAT.

The anode AN may have conductivity. The anode AN may be a pixel electrode, or may instead a cathode. The anode AN may be a transmissive electrode, a transflective electrode, or a reflective electrode. In a case in which the anode AN is a transmissive electrode, the anode AN may be formed of a transparent metal oxide, such as indium tin oxide (ITO), indium zinc oxide (IZO), zinc oxide (ZnO), and/or indium tin zinc oxide (ITZO). In a case in which the anode AN is a transflective electrode or a reflective electrode, the anode AN may include at least one of aluminum (Al), copper (Cu), titanium (Ti), molybdenum (Mo), silver (Ag), magnesium (Mg), platinum (Pt), palladium (Pd), gold (Au), nickel (Ni), neodymium (Nd), iridium (Ir), and/or chromium (Cr).

An organic layer may be at the anode AN. The organic layer may include the emission layer EML. The organic layer may further include the hole transport region HTR and/or the electron transport region ETR.

The hole transport region HTR may be provided at the anode AN. The hole transport region HTR may include at least one of a hole injection layer, a hole transport layer, a buffer layer, and/or an electron blocking layer.

The hole transport region HTR may be a single layer formed of a single material, may be a single layer formed of a plurality of different materials, or may have a multilayered structure having a plurality of layers formed of a plurality of different materials.

As a non-limiting example, the hole transport region HTR may have a structure of single layers formed of a plurality of different materials, or may have a structure of hole injection layer/hole transport layer, hole injection layer/hole transport layer/buffer layer, hole injection layer/buffer layer, hole transport layer/buffer layer, or hole injection layer/hole transport layer/electron blocking layer, which may be sequentially stacked from the anode AN, although the inventive concept is not limited thereto.

The hole transport region HTR may be formed by using various methods, such as a vacuum deposition method, a spin coating method, a casting method, a Langmuir-Blodgett (LB) method, an inkjet printing method, a laser printing method, or a laser induced thermal imaging (LITI) method.

In a case in which the hole transport region HTR includes the hole injection layer, the hole transport region HTR may include a phthalocyanine compound, such as copper phthalocyanine; N,N'-diphenyl-N,N'-bis-[4-(phenyl-m-tolyl-amino)-phenyl]-biphenyl-4,4'-diamine (DNTPD), 4,4',4"-tris(3-methylphenyl phenylamino)triphenylamine (m-MTDATA), 4,4'4"-tris(N,N-diphenylamino)triphenylamine (TDATA), 4,4',4"-tris{N,-(2-naphthyl)-N-phenylamino}-triphenylamine (2TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), and/or (polyaniline)/poly(4-styrenesulfonate) (PANI/PSS), although the inventive concept is not limited thereto.

In a case in which the hole transport region HTR includes the hole transport layer, the hole transport region HTR may include a carbazole-based derivative, such as N-phenyl carbazole and polyvinyl carbazole, a fluorine-based derivative, a triphenylamine-based derivative, such as N,N'-bis(3-methylphenyl)-N,N'-diphenyl-[1,1-biphenyl]-4,4'-diamine (TPD) and 4,4',4"-tris(N-carbazolyl)triphenylamine (TCTA), N,N'-di(1-naphthyl)-N,N'-diphenylbenzidine (NPB), and/or 4,4'-cyclohexylidene bis[N,N-bis(4-methylphenyl)benzenamine] (TAPC), although the inventive concept is not limited thereto.

In addition to the above-described materials, the hole transport region HTR may further include a charge-generating material for improving conductivity. The charge-generating material may be uniformly or non-uniformly dispersed in the hole transport region HTR. The charge-generating material may be a p-type dopant. The p-type dopant may be one of a quinone derivative, a metal oxide, and/or a cyano group-containing compound, although the inventive concept is not limited thereto. As non-limiting examples, the p-type dopant may include a quinone derivative, such as tetracyanoquinodimethane (TCNQ) and 2,3,5, 6-tetrafluoro-tetracyanoquinodimethane (F4-TCNQ), and/or a metal oxide such as tungsten oxide and molybdenum oxide, although the inventive concept is not limited thereto.

The emission layer EML may be provided on the hole transport region HTR. The emission layer EML may be a single layer formed of a single material, may be a single layer formed of a plurality of different materials, or may have a multilayered structure having a plurality of layers formed of a plurality of different materials.

A material of the emission layer EML, as a non-limiting example, may be formed of a material that emits red light, green light, or blue light, and may include a fluorescent material and/or a phosphorescent material. Also, the emission layer EML may include a host and/or a dopant.

A material of the host, as a no-limiting example, may use tris(8-hydroxyquinolino)aluminum (Alq3), 4,4'-bis(N-carbazolyl)-1,1'-biphenyl (CBP), poly(n-vinylcabazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), or 2-methyl-9,10-bis(naphthalen-2-yl)anthracene (MADN).

In a case in which the emission layer EML is configured to emit red light, the emission layer EML, as a non-limiting example, may include a fluorescent material including tris (dibenzoylmethanato)phenanthoroline europium (PBD:Eu (DBM)3(Phen)) or perylene. In the case that the emission layer EML is configured to emit red light, the dopant included in the emission layer EML may be selected from a metal complex or organometallic complex such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), and/or octaethylporphyrin platinum (PtOEP), for example.

In a case in which the emission layer EML is configured to emit green light, the emission layer EML, as a non-limiting example, may include a fluorescent material including tris(8-hydroxyquinolino)aluminum (Alq3). In the case that the emission layer EML is configured to emit green light, the dopant included in the emission layer EML, as a non-limiting example, may be selected from a metal complex or organometallic complex such as fac-tris(2-phenylpyridine)iridium (Ir(ppy)3).

In a case in which the emission layer EML is configured to emit blue light, the emission layer EML, as a non-limiting example, may include a fluorescent material, which includes one selected from the group consisting of spiro-DPVBi, spiro-6P, distyryl-benzene (DSB), distyrylarylene (DSA), a polyfluorene (PFO)-based polymer, a poly(p-phenylene vinylene) (PPV)-based polymer, or a combination thereof. In the case that the emission layer EML is configured to emit blue light, the dopant included in the emission layer EML, for example, may be selected from a metal complex or organometallic complex such as (4,6-F2ppy)2lrpic. The emission layer EML will be described in more detail later.

The electron transport region ETR may be provided on the emission layer EML. The electron transport region ETR may include at least one of a hole blocking layer, an electron transport layer, and an electron injection layer, but the inventive concept is not limited thereto.

In a case in which the electron transport region ETR includes the electron transport layer, the electron transport region ETR may include tris(8-hydroxyquinolinato)aluminum (Alq3), 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butyphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate) (Bebq2), 9,10-di(naphthalene-2-yl)anthracene (ADN), or a mixture thereof, but the inventive concept is not limited thereto. A thickness of the electron transport region ETR may be in a range of about 100 Å to about 1,000 Å, for example, about 150 Å to about 500 Å. In a case in which the thickness of the electron transport region ETR satisfies the above-described range, satisfactory electron transport characteristics may be obtained without a substantial increase in driving voltage.

In the case where the electron transport region ETR includes the electron injection layer, LiF, lithium quinolate (LiQ), $Li_2O$, BaO, NaCl, CsF, a lanthanide metal, such as ytterbium (Yb), and/or a metal halide, such as RbCl and Rbl, may be used in the electron transport region ETR, but the inventive concept is not limited thereto. The electron injection layer may also be formed of a material in which an electron transport material and an insulating organometallic salt are mixed. The organometallic salt may be a material having an energy band gap of about 4 eV or more. As a non-limiting example, the organometallic salt may be metal acetate, metal benzoate, metal acetoacetate, metal acetylacetonate, or metal stearate. A thickness of the electron injection layer may be in a range of about 1 Å to about 100 Å, as a non-limiting example, about 3 Å to about 90 Å. In a case in which the thickness of the electron injection layer satisfies the above-described range, satisfactory electron injection characteristics may be obtained without a substantial increase in driving voltage.

As described above, the electron transport region ETR may include the hole blocking layer. The hole blocking layer, for example, may include at least one of 2,9-dimethyl-4,7-diphenyl-1,10-phenanthroline (BCP) and/or 4,7-diphenyl-1,10-phenanthroline (Bphen), but the inventive concept is not limited thereto.

The cathode CAT may be provided on the electron transport region ETR. The cathode CAT may be a common electrode, or may instead be an anode. The cathode CAT may be a transmissive electrode, a transflective electrode, or a reflective electrode. In a case in which the cathode CAT is a transmissive electrode, the cathode CAT may include lithium (Li), calcium (Ca), LiF/Ca, LiF/Al, Al, Mg, BaF, barium (Ba), Ag, and/or a compound or mixture thereof (e.g., mixture of Ag and Mg).

The cathode CAT may include an auxiliary electrode. The auxiliary electrode may include a film formed to face the emission layer EML by depositing any of the foregoing materials, and by depositing a transparent metal oxide film on the film, the transparent metal oxide film being made of, for example, indium tin oxide (ITO), indium zinc oxide (IZO), zinc oxide (ZnO), and/or indium tin zinc oxide (ITZO). Alternatively, the auxiliary electrode may include Mo and Ti.

In a case in which the cathode CAT is a transflective electrode or a reflective electrode, the cathode CAT may include Ag, Mg, Cu, Al, Pt, Pd, Au, Ni, Nd, Ir, Cr, Li, Ca, LiF/Ca, LiF/Al, Mo, Ti, or a compound or mixture thereof (e.g., mixture of Ag and Mg). Alternatively, the cathode CAT may have a multilayer structure including a reflective layer or a transflective layer formed of the above materials and a transparent conductive layer formed of ITO, IZO, ZnO, and/or ITZO.

In a case in which the organic electroluminescent device OEL is a top emission type, the anode AN may be a reflective electrode, and the cathode CAT may be a transmissive electrode or a transflective electrode. In a case in which the organic electroluminescent device OEL is a bottom emission type, the anode AN may be a transmissive electrode or a transflective electrode, and the cathode CAT may be a reflective electrode.

In the organic electroluminescent device OEL, when applying voltages respectively to the anode AN and the cathode CAT, holes injected from the anode AN may move to the emission layer EML through the hole transport region HTR, and electrons injected from the cathode CAT may move to the emission layer EML through the electron transport region ETR. The holes and electrons may be recombined in the emission layer EML to generate excitons, and light may be generated when the excitons drop from an excited state to a ground state.

The encapsulation layer SL may be provided on the cathode CAT. The encapsulation layer SL may cover the cathode CAT. The encapsulation layer SL may include at least one layer of an organic layer, an inorganic layer, or a hybrid layer in which an organic material and an inorganic material are mixed. The encapsulation layer SL, for example, may be a thin film encapsulation layer. The encapsulation layer SL may protect the organic electroluminescent device OEL. The encapsulation layer SL may be substituted with a second base substrate. The second base substrate may be a plastic substrate, a glass substrate, a quartz substrate, or a polymer substrate. The second base substrate may be a transparent insulating substrate.

Referring to FIGS. 1A to 1D, 2A, and 2F, the display member 100 may include a liquid crystal display panel.

The driving circuit layer 110 may include the first base substrate BS1 and the circuit layer 112 (e.g., see FIG. 2E). The circuit layer 112 may include the conductive pattern and the circuit insulating layer. The conductive pattern may include the gate line, the data line, and the thin film transistor TFT. The circuit insulating layer may include the gate insulating layer GI and the insulation layer INL.

The first base substrate BS1 may be a plastic substrate, a glass substrate, a quartz substrate, or a polymer substrate. The first base substrate BS1 may be a transparent insulating substrate. The gate line and the data line may be at the first base substrate BS1.

The thin film transistor TFT may be provided at the first base substrate BS1. The thin film transistor TFT may include the gate electrode GE, the semiconductor pattern SM, the source electrode SE, and the drain electrode DE.

The gate electrode GE may be branched from the gate line, or may be provided on some areas of the gate line. The gate electrode GE may be formed of a metal. The gate electrode GE may be composed of a plurality of layers. The gate electrode GE, for example, may be formed of nickel, chromium, molybdenum, aluminum, titanium, copper, tungsten, and/or an alloy containing these metals.

The gate insulating layer GI may be on the gate electrode GE. The gate insulating layer GI may be provided at an entire surface of the first base substrate BS1, and may cover the gate electrode GE.

The semiconductor pattern SM may be provided at the gate insulating layer GI. The semiconductor pattern SM may be provided at the gate electrode GE having the gate insulating layer GI therebetween so that some areas of the semiconductor pattern SM may overlap the gate electrode GE.

The source electrode SE may be provided by being branched from the data line. Some areas of the source electrode SE may overlap the gate electrode GE. The drain electrode DE may be provided by being spaced apart from the source electrode SE having the semiconductor pattern SM therebetween. Some areas of the drain electrode DE may be provided so as to overlap the gate electrode GE.

The source electrode SE and drain electrode DE may be composed of a single layer or a plurality of layers. The source electrode SE and drain electrode DE, for example, may be formed of nickel, chromium, molybdenum, aluminum, titanium, copper, tungsten, and/or an alloy containing these metals.

The insulation layer INL may be provided on the source electrode SE and the drain electrode DE. The insulation layer INL may be a single layer, or may be a plurality of layers. The insulation layer INL may include at least one layer of an organic layer, an inorganic layer, or a hybrid layer in which an organic material and an inorganic material are mixed.

The display layer 120 may include a pixel electrode PE, a second base substrate BS2, a color filter CF, a black matrix BM, and a common electrode CE. The display layer 120 may further include a planarization layer OC. Hereinafter, although it has been described that the color filter CF, the black matrix BM, and the common electrode CE are included in the display layer 120, the inventive concept is not limited thereto, and the color filter CF, the black matrix BM, and the common electrode CE may be included in the driving circuit layer 110.

The pixel electrode PE may be connected to the drain electrode DE through a contact hole CH. The pixel electrode PE may include at least one of a metal or a transparent conductive oxide. The transparent conductive oxide may include ITO, IZO, and/or ITZO.

The second base substrate BS2 may be a plastic substrate, a glass substrate, a quartz substrate, or a polymer substrate. The second base substrate BS2 may be a transparent insulating substrate.

The color filter CF may be provided at a bottom surface of the second base substrate BS2. The color filter CF may provide a color to light that transmits, or passes through, a liquid crystal layer LC.

The black matrix BM may correspond to a light-shielding region of the driving circuit layer 110. The light-shielding region may be a region in which the data line, the thin film transistor TFT, and the gate line are formed. Because the pixel electrode PE is not typically provided in the light-shielding region, liquid crystal molecules are not aligned, so that light leakage may occur. Thus, the black matrix BM may be provided at the light-shielding region to shield the light leakage. The black matrix BM may be formed by forming a light-shielding layer configured to absorb light, and by patterning the light-shielding layer using photolithography, and the black matrix BM may also be selectively formed by other methods, for example, an inkjet method.

The planarization layer OC may be provided on the color filter CF and the black matrix BM. The planarization layer OC may maintain the bottom surface of the second base substrate BS2, on which the color filter CF and black matrix BM are flat.

The common electrode CE may be provided at the planarization layer OC. The common electrode CE may include at least one of a metal or a transparent conductive oxide. The transparent conductive oxide may include ITO, IZO, and/or ITZO.

The liquid crystal layer LC may be provided between the driving circuit layer 110 and the display layer 120. The liquid crystal layer LC may include a plurality of liquid crystal molecules having dielectric anisotropy. When an electric field is applied between the pixel electrode PE and the common electrode CE, the liquid crystal molecules of the liquid crystal layer LC may rotate, or align, in a specific direction between the driving circuit layer 110 and the display layer 120, and transmittance of light incident on the liquid crystal layer LC may be accordingly adjusted.

Referring again to FIGS. 1A to 1D, the display member 100 may include the driving circuit layer 110 and the display layer 120. As described above, the display member 100 may be a touch screen panel or a display panel. However, the inventive concept is not limited thereto, and each of the driving circuit layer 110 and the display layer 120 may be a touch screen panel, a display panel, or an optical member.

As shown in FIG. 1C, the driving circuit layer 110 may include a first substrate portion 111, a second substrate portion 113, and a third substrate portion 115. The first substrate portion 111 may contact the display layer 120. In a plane view, the first substrate portion 111 may overlap each of the display layer 120, the second adhesive member 220, and a first window portion 301. On the plane, the first substrate portion 111 does not overlap a second window portion 303. On the plane, the first substrate portion 111 may be spaced apart (e.g., in the first direction DR1) from each of the first adhesive member 210 and a third window portion 305.

The second substrate portion 113 may be connected to the first substrate portion 111. On the plane (e.g., with respect to the first direction DR1), the second substrate portion 113 may be provided between the display layer 120 and the first adhesive member 210. On the plane, the second substrate portion 113 may be provided between the first adhesive member 210 and the second adhesive member 220. On the plane, the second substrate portion 113 may overlap the second window portion 303. On the plane, the second substrate portion 113 does not overlap each of the display layer 120, the first adhesive member 210, the second adhesive member 220, the first window portion 301, and the third window portion 305.

The third substrate portion 115 may be connected to the second substrate portion 113, and at least a portion thereof may be in contact with the first adhesive member 210. On the plane, the third substrate portion 115 may overlap the first adhesive member 210, and may overlap at least a portion of the third window portion 305. On the plane, the third substrate portion 115 may be spaced apart from each of the display layer 120, the second adhesive member 220, and the first window portion 301. On the plane, the third substrate portion 115 does not overlap the second window portion 303.

The display layer 120 may be provided on the driving circuit layer 110. The display layer 120 may overlap a portion of the driving circuit layer 110. On the plane, the display layer 120 may overlap the first substrate portion 111 and the first window portion 301. On the plane, the display layer 120 does not overlap the second substrate portion 113 and the second window portion 303. On the plane, the display layer 120 may be spaced apart from the third substrate portion 115, the first adhesive member 210, and the third window portion 305.

The first adhesive member 210 bonds the driving circuit layer 110 and the window 300. A thickness t1 of the first adhesive member 210 may be greater than a thickness t2 of the second adhesive member 220. On the plane, the first adhesive member 210 may overlap each of the third substrate portion 115 and the third window portion 305. On the plane, the first adhesive member 210 does not overlap each of the second substrate portion 113 and the second window portion 303. On the plane, the first adhesive member 210 may be spaced apart from each of the first substrate portion 111, the display layer 120, the second adhesive member 220, and the first window portion 301.

The first adhesive member 210 may be a double-sided adhesive tape. The first adhesive member 210 may be composed of a single layer. The first adhesive member 210 may include a first adhesive and an ultraviolet (UV) curing agent. The first adhesive may include, for example, at least one of acrylic acid, 2-ethylhexyl acrylate, 2-methylbutyl acrylate, isooctyl acrylate, lauryl acrylate, ethyl acrylate, butyl acrylate, hexyl acrylate, octyl acrylate, decyl acrylate, isodecyl acrylate, a butyl acrylate monomer, an ethyl acrylate monomer, an acrylic acid monomer, and/or 2-2'-azobisisobutyronitrile.

The UV curing agent may include, for example, at least one of aliphatic urethane acrylate, caprolactone acrylate, 1,6-hexanediol diacrylate, trimethylolpropane triacrylate, pentaerythritol triacrylate, lauryl acrylate, urethane acrylate, epoxy acrylate, polyester acrylate, and/or silicon acrylate.

The first adhesive member 210 may further include a photoinitiator. The photoinitiator may include at least one of benzoyl peroxide, acetyl peroxide, diauryl peroxide, hydrogen peroxide, potassium persulfonate, 2,2'-azobisisobutylnitrile, and/or hydroxy dimethyl acetophenone.

The first adhesive member 210 may be provided by UV curing an adhesive solution including the first adhesive, the UV curing agent, and the photoinitiator. Because an elastic modulus of the first adhesive member 210 after the UV curing may be improved in comparison to an elastic modulus of the first adhesive member 210 before the UV curing, the first adhesive member 210 may sufficiently absorb an impact that may be provided to the display device 10.

Referring to FIG. 1D, the first adhesive member 210 may be composed of a plurality of layers. The first adhesive member 210 may include a first adhesive layer 211, a resin layer 213 provided on the first adhesive layer 211, and a second adhesive layer 215 provided on the resin layer 213.

The first adhesive layer 211 may be bonded to the driving circuit layer 110. The first adhesive layer 211, for example, may include a first adhesive and a UV curing agent. The first adhesive layer 211 may further include a photoinitiator.

The resin layer 213 may not be particularly limited as long as it is typically used in the art and, for example, may include polyethylene terephthalate (PET), polyethylene naphthalate (PEN), polyimide, and polyethersulfone.

The second adhesive layer 215 may be bonded to the window 300. The second adhesive layer 215 may be provided on the resin layer 213. The second adhesive layer 215, for example, may include a first adhesive and a UV curing agent. The first adhesive included in the second adhesive layer 215 may be the same as, or different from, the first adhesive included in the first adhesive layer 211. Also, the UV curing agent included in the second adhesive layer 215 may be the same as, or different from, the UV curing agent included in the first adhesive layer 211. The second adhesive layer 215 may further include a photoinitiator. The photoinitiator included in the second adhesive layer 215 may be the same as, or different from, the photoinitiator included in the first adhesive layer 211.

Referring to FIGS. 1A to 1C, the second adhesive member 220 may bond the display layer 120 and the window 300. In a plane view, the second adhesive member 220 may overlap each of the first substrate portion 111, the display layer 120, and the first window portion 301. On the plane, the second adhesive member 220 does not overlap each of the second substrate portion 113 and the second window portion 303. On the plane, the second adhesive member 220 may be spaced apart from each of the third substrate portion 115, the first adhesive member 210, and the third window portion 305. The second adhesive member 220 may be the same as, or different from, the first adhesive member 210.

The first window 300 may include the first window portion 301, the second window portion 303, and the third window portion 305. The first window portion 301 may be in contact with the second window portion 303. In a plane view, the first window portion 301 may overlap each of the first substrate portion 111, the display layer 120, and the second adhesive member 220. On the plane, the first window portion 301 does not overlap the second substrate portion 113. On the plane, the first window portion 301 may be spaced apart from each of the third substrate portion 115 and the first adhesive member 210.

The second window portion 303 may be connected to the first window portion 301. On the plane, the second window portion 303 may be provided between the first adhesive member 210 and the second adhesive member 220. On the plane, the second window portion 303 may overlap the second substrate portion 113. On the plane, the second window portion 303 does not overlap each of the first substrate portion 111, the third substrate portion 115, the first adhesive member 210, and the second adhesive member 220.

The third window portion 305 may be connected to the second window portion 303, and at least a portion thereof may be in contact with the first adhesive member 210. On the plane, the third window portion 305 may overlap the first adhesive member 210. At least a portion of the third window portion 305 may overlap the third substrate portion 115. On the plane, the third window portion 305 may be spaced apart from each of the first substrate portion 111, the display layer 120, and the second adhesive member 220. On the plane, the third window portion 305 does not overlap the second substrate portion 113.

FIG. 3A is an exploded perspective view schematically illustrating the display device according to an embodiment, and FIG. 3B is a schematic cross-sectional view corresponding to FIG. 3A.

Referring to FIGS. 3A and 3B, the display device 10 according to an embodiment may further include a printed circuit board 130 and the tape carrier package (TCP) 140.

The printed circuit board 130 may be electrically connected to the display member 100. The printed circuit board 130 may be electrically connected to the driving circuit layer 110. The printed circuit board 130 may drive the display member 100. The printed circuit board 130 may include a driver configured to provide a driving signal to the display member 100. Although the driver may be included in the printed circuit board 130, the driver may also be included in the tape carrier package 140 instead.

The driver may generate a driving signal to drive the display member 100 in response to an external signal. The external signal may be a signal provided from the printed circuit board 130, and a video signal, various control signals, and/or a driving voltage may be included in the external signal.

A gate signal and a data signal may be used to display an image on the display member 100, and the driver may include a data driver that converts a video signal into a data signal to transmit the data signal to the display member 100. However, the inventive concept is not limited thereto, and the data driver may be composed of a chip, and may be mounted on the tape carrier package 140 or may be mounted in the form of chip on glass (COG) on the driving circuit layer 110.

A gate driver that is configured to generate the gate signal may be directly provided on the driving circuit layer 110. However, the inventive concept is not limited thereto, and the gate driver may be composed of a chip, and may be mounted on the tape carrier package 140 or the driver.

The tape carrier package 140 may be connected to each of the display member 100 and the printed circuit board 130. The tape carrier package 140 may be connected to each of the driving circuit layer 110 and the printed circuit board 130. The tape carrier package 140 may be provided in the form of a film having elasticity.

The tape carrier package 140 may be in contact with a portion of the step ST of the display member 100. The tape carrier package 140 may contact the driving circuit layer 110. The tape carrier package 140 may contact a portion of the third substrate portion 115. The tape carrier package 140 is not in contact with the display layer 120. The tape carrier package 140 may be spaced apart from the first adhesive member 210.

Figure 4A:
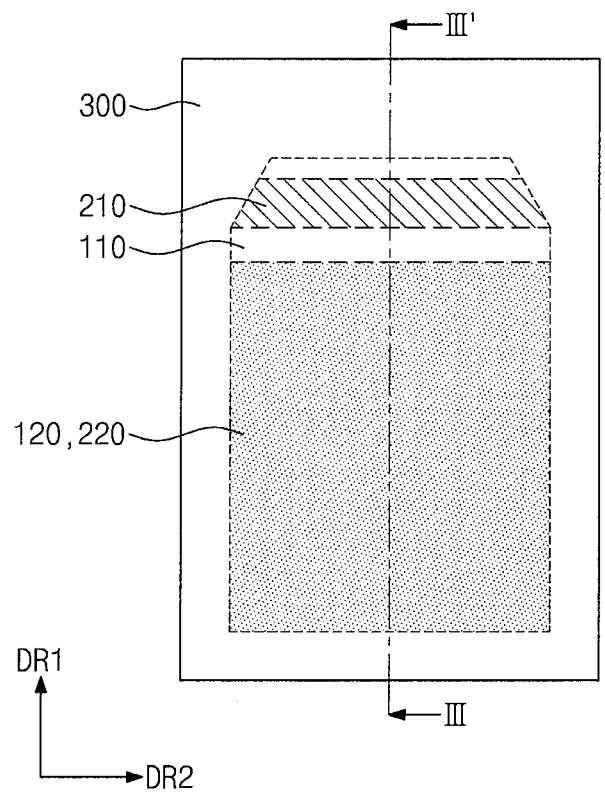
FIG. 4A is a plan view schematically illustrating the display device according to an embodiment.
Figure 4B:
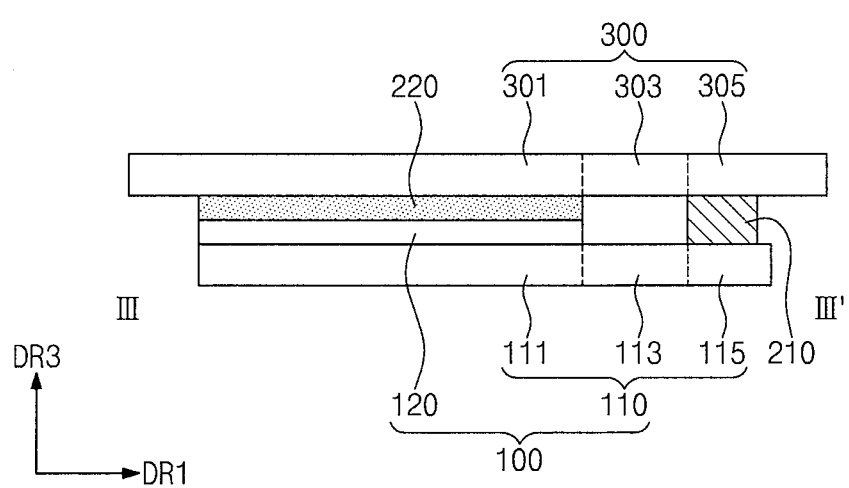
FIG. 4B is a schematic cross-sectional view taken along the line III-III' of FIG. 4A.
Figure 5A:
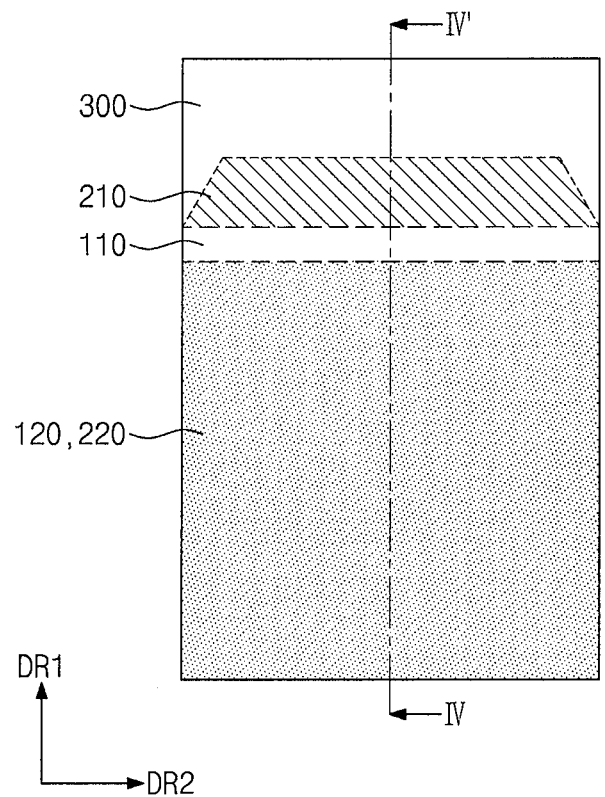
FIG. 5A is a plan view schematically illustrating the display device according to an embodiment.
Figure 5B:
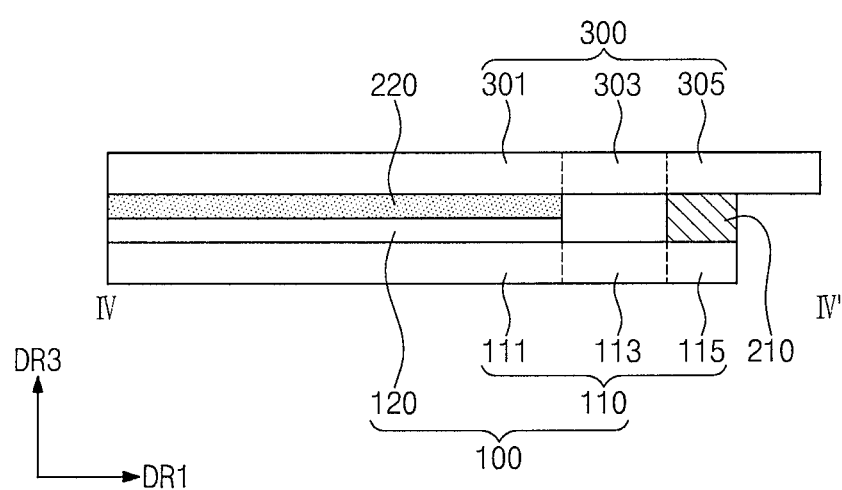
FIG. 5B is a schematic cross-sectional view taken along the line IV-IV' of FIG. 5A.
Figure 6A:
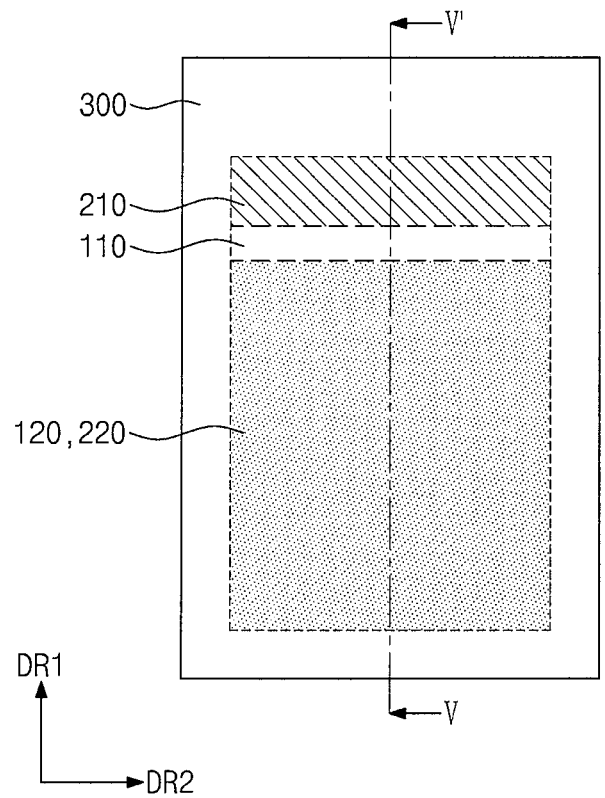
FIG. 6A is a plan view schematically illustrating the display device according to an embodiment.
Figure 6B:
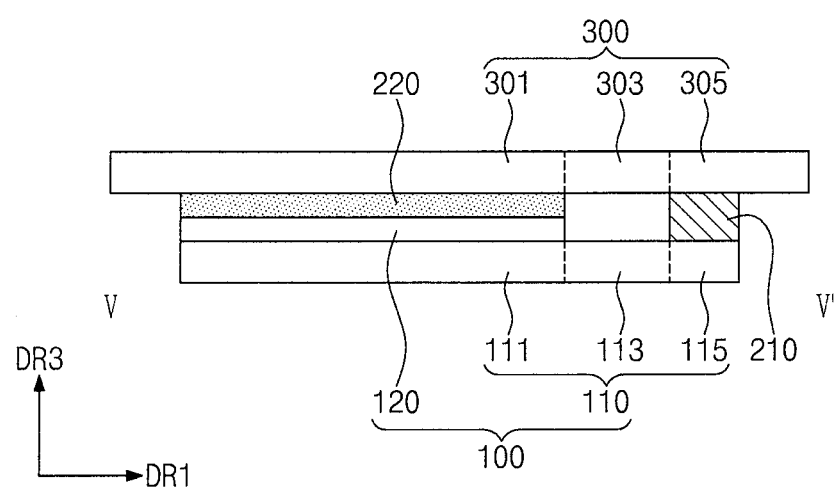
FIG. 6B is a schematic cross-sectional view taken along the line V-V of FIG. 6A.
Figure 7A:
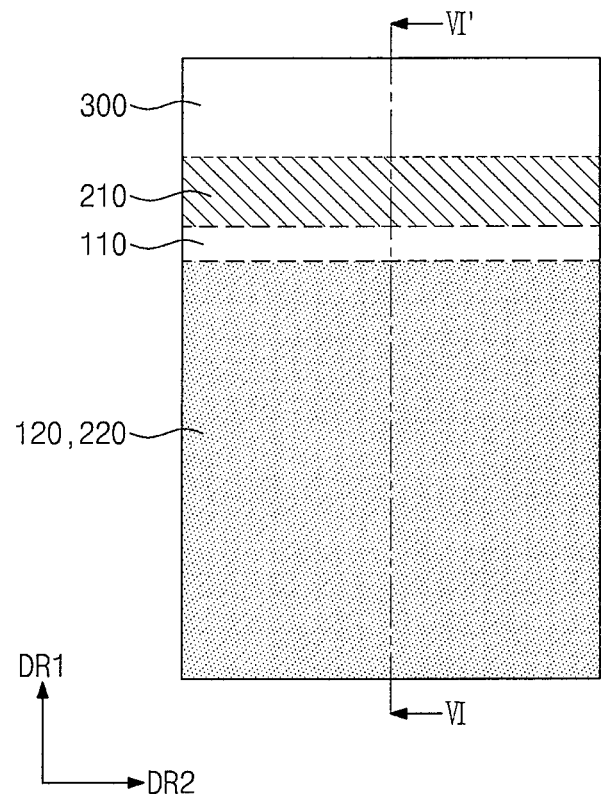
FIG. 7A is a plan view schematically illustrating the display device according to an embodiment.
Figure 7B:
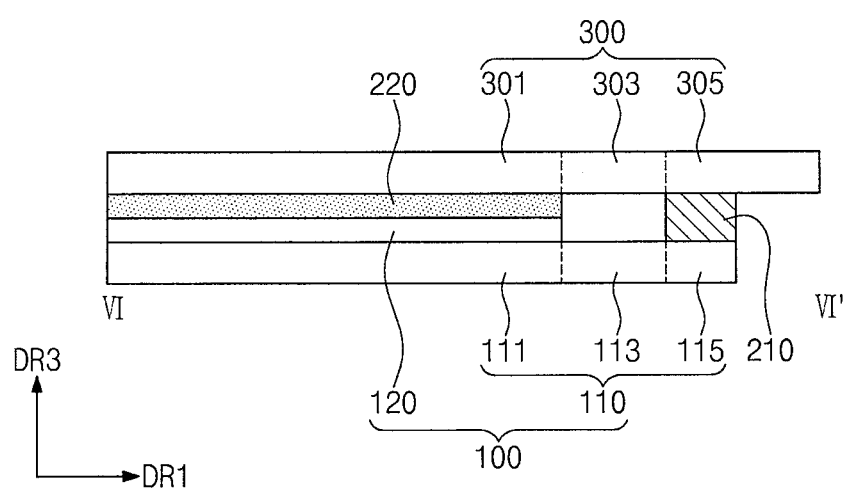
FIG. 7B is a schematic cross-sectional view taken along the line VI-VI' of FIG. 7A.

FIG. 4A is a plan view schematically illustrating the display device according to an embodiment, FIG. 4B is a schematic cross-sectional view taken along the line III-III' of FIG. 4A, FIG. 5A is a plan view schematically illustrating the display device according to an embodiment, FIG. 5B is a schematic cross-sectional view taken along the line IV-IV' of FIG. 5A, FIG. 6A is a plan view schematically illustrating the display device according to an embodiment, FIG. 6B is a schematic cross-sectional view taken along the line V-V' of FIG. 6A, FIG. 7A is a plan view schematically illustrating the display device according to an embodiment, and FIG. 7B is a schematic cross-sectional view taken along the line VI-VI' of FIG. 7A.

Hereinafter, a positional relationship between the driving circuit layer 110, the display layer 120, the window 300, the first adhesive member 210, and the second adhesive member 220 will be described in detail with reference to FIGS. 4A, 4B, 5A, 5B, 6A, 6B, 7A, and 7B.

Referring to FIGS. 4A and 4B, in a plane view, an area of the window 300 may be greater than an area of the driving circuit layer 110. On the plane, the window 300 may have a rectangular shape. On the plane, the driving circuit layer 110 may have a hexagonal shape that is formed by cutting triangular shapes from two corners of a rectangular shape. On the plane, the driving circuit layer 110 may be provided in the window 300. On the plane, the first adhesive member 210 may have a trapezoidal shape. On the plane, the second adhesive member 220 may have a rectangular shape.

On the plane, each of the first substrate portion 111, the display layer 120, and the second adhesive member 220 may overlap a portion of the first window portion 301. On the plane, the third substrate portion 115 may overlap a portion of the third window portion 305. On the plane, the first adhesive member 210 may overlap a portion of the third substrate portion 115. On the plane, the first adhesive member 210 may overlap a portion of the third window portion 305.

On the plane, each of the first substrate portion 111, the display layer 120, and the second adhesive member 220 may overlap a portion of the first window portion 301. On the plane, each of the third substrate portion 115 and the first adhesive member 210 may overlap a portion of the third window portion 305.

Referring to FIGS. 5A and 5B, in a plane view, an area of the window 300 may be greater than an area of the driving circuit layer 110. On the plane, the window 300 may have a rectangular shape. On the plane, the driving circuit layer 110 may have a hexagonal shape that is formed by cutting a triangular shape from each of two corners of a rectangular shape. On the plane, the driving circuit layer 110 may be provided in the window 300.

On the plane, one end of each of the first substrate portion 111, the display layer 120, the second adhesive member 220, and the first window portion 301 may coincide with one another. On the plane, each of the third substrate portion 115 and the first adhesive member 210 may overlap a portion of the third window portion 305.

Referring to FIGS. 6A and 6B, in a plane view, an area of the window 300 may be greater than an area of the driving circuit layer 110. On the plane, the window 300 may have a rectangular shape. On the plane, the driving circuit layer 110 may have a rectangular shape. On the plane, the first adhesive member 210 may have a rectangular shape. On the plane, the second adhesive member 220 may have a rectangular shape.

On the plane, each of the first substrate portion 111, the display layer 120, and the second adhesive member 220 may overlap a portion of the first window portion 301. On the plane, each of the third substrate portion 115 and the first adhesive member 210 may overlap a portion of the third window portion 305.

Referring to FIGS. 7A and 7B, in a plane view, an area of the window 300 may be greater than an area of the driving circuit layer 110. On the plane, the window 300 may have a rectangular shape. On the plane, the driving circuit layer 110 may have a rectangular shape. On the plane, one end of the driving circuit layer 110 may coincide with one end of the window 300. On the plane, the first adhesive member 210 may have a rectangular shape. On the plane, the second adhesive member 220 may have a rectangular shape.

On the plane, one end of each of the first substrate portion 111, the display layer 120, the second adhesive member 220, and the first window portion 301 may coincide with one another. On the plane, each of the third substrate portion 115 and the first adhesive member 210 may overlap a portion of the third window portion 305.

Although the positional relationship between the driving circuit layer 110, the display layer 120, the first adhesive member 210, the second adhesive member 220, and the window 300, as well as the shape of each, of different embodiments have been illustrated in FIGS. 4A, 4B, 5A, 5B, 6A, 6B, 7A, and 7B, the inventive concept is not limited thereto. If the first adhesive member 210 is provided at the step of the display member 100, the driving circuit layer 110, the display layer 120, the first adhesive member 210, the second adhesive member 220, and the window 300 may have various positional relationships, and each of the driving circuit layer 110, the display layer 120, the first adhesive member 210, the second adhesive member 220, and the window 300 may have various other shapes.

Figure 8A:
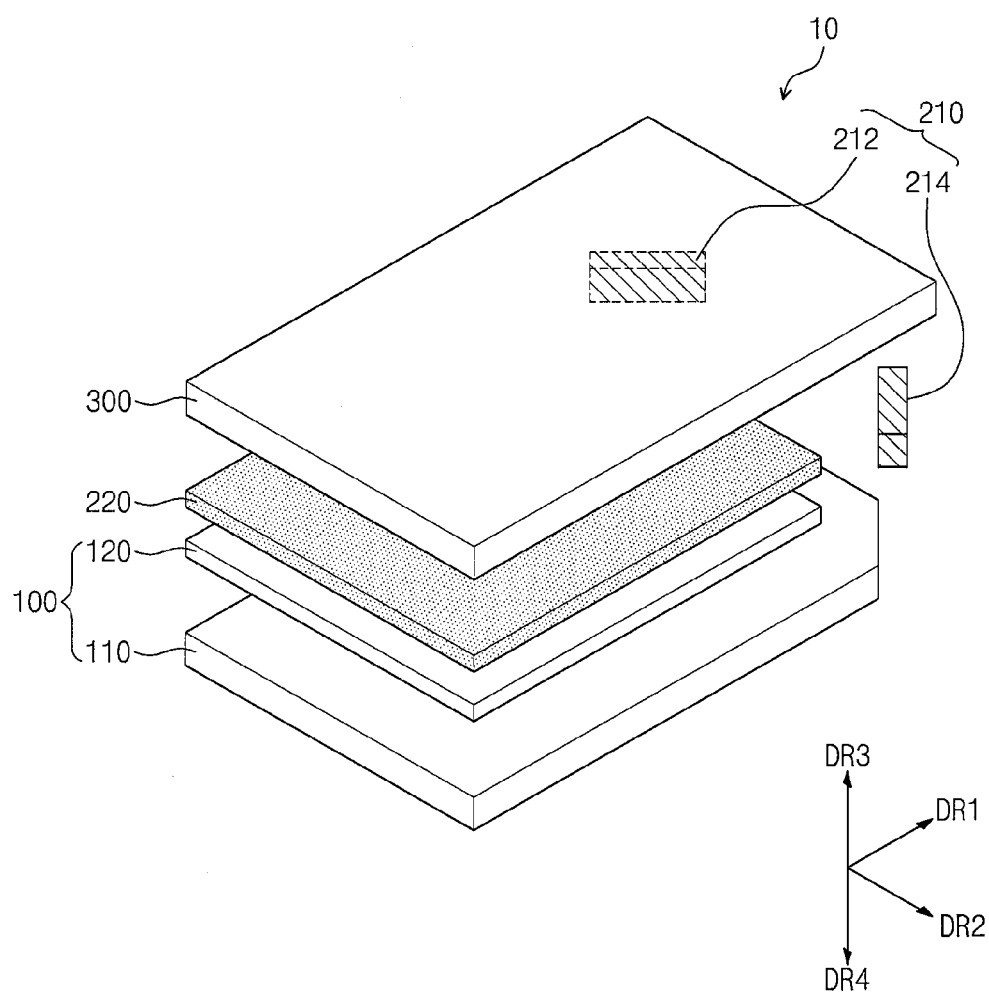
FIG. 8A is an exploded perspective view schematically illustrating the display device according to an embodiment.
Figure 8B:
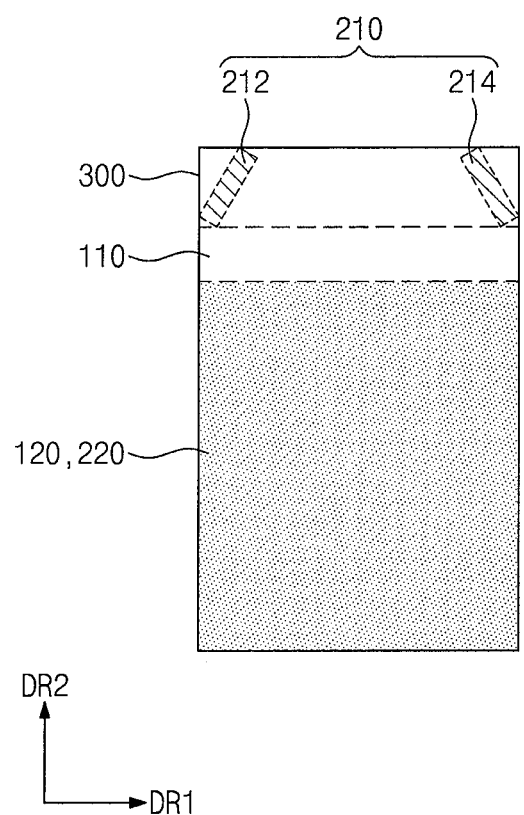
FIG. 8B is a schematic plan view corresponding to FIG. 8A.
Figure 9A:
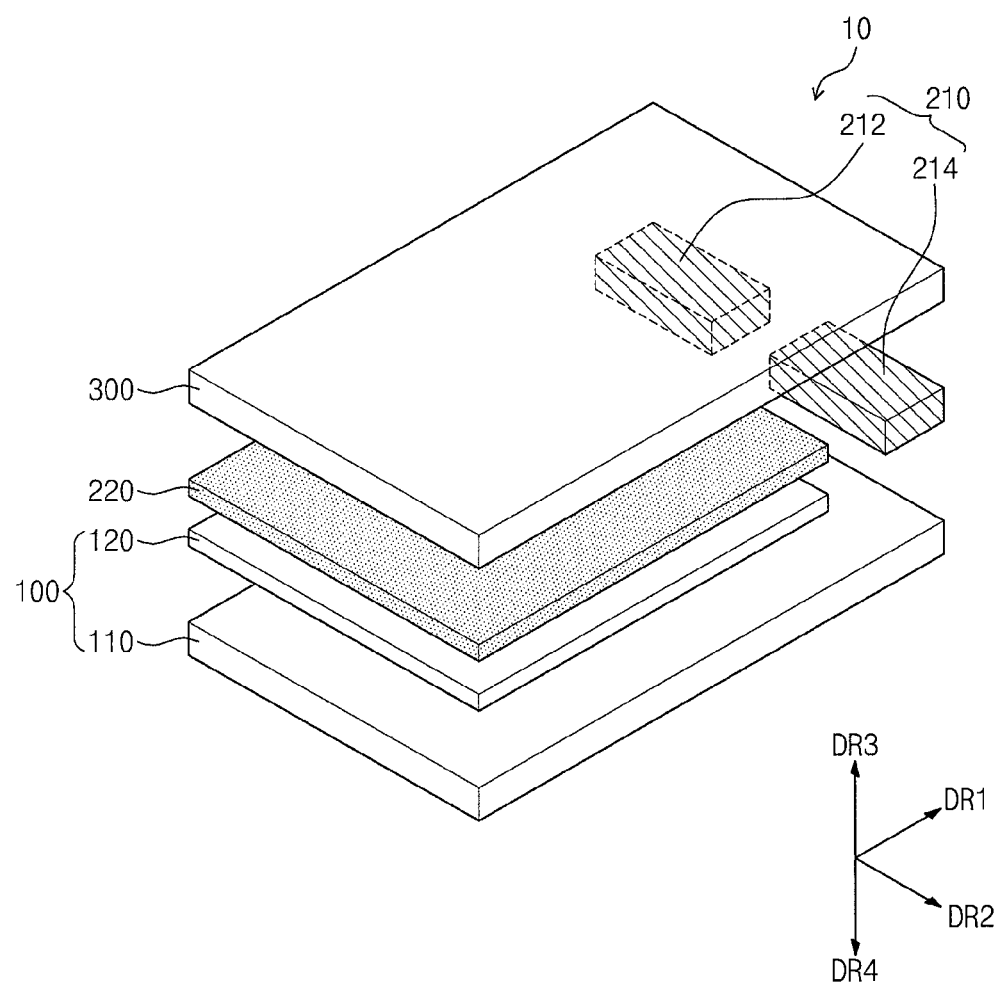
FIG. 9A is an exploded perspective view schematically illustrating the display device according to an embodiment.
Figure 9B:
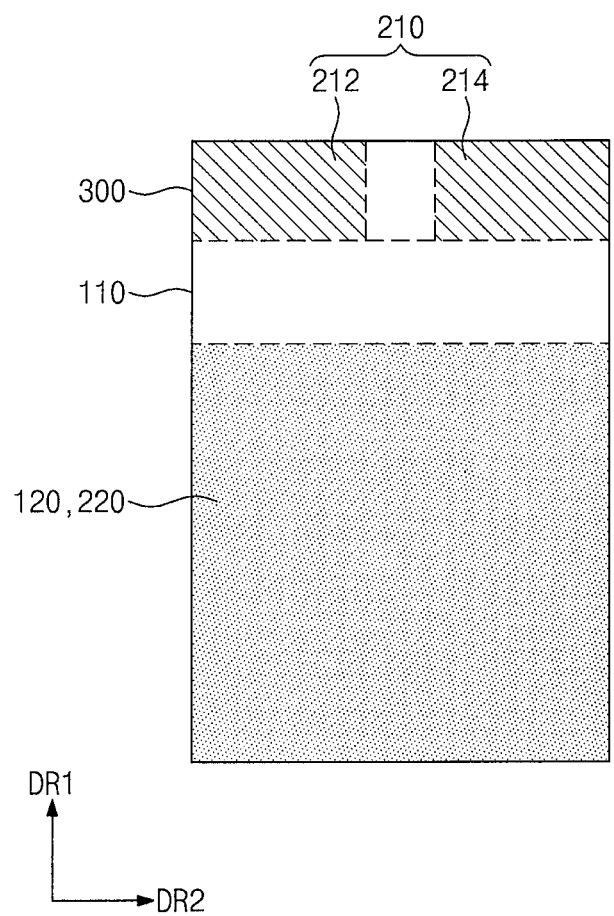
FIG. 9B is a schematic plan view corresponding to FIG. 9A.

FIG. 8A is an exploded perspective view schematically illustrating the display device according to an embodiment, FIG. 8B is a schematic plan view corresponding to FIG. 8A, FIG. 9A is an exploded perspective view schematically illustrating the display device according to an embodiment, and FIG. 9B is a schematic plan view corresponding to FIG. 9A.

Referring to FIGS. 8A, 8B, 9A, and 9B, the first adhesive member 210 may include a first sub-adhesive member 212 and a second sub-adhesive member 214. The first sub-adhesive member 212 and the second sub-adhesive member 214 may be spaced apart from each other. In a plane view, each of the first sub-adhesive member 212 and the second sub-adhesive member 214 may have a rectangular shape. However, the inventive concept is not limited thereto, and, on the plane, each of the first sub-adhesive member 212 and the second sub-adhesive member 214 may have a polygonal shape, such as circular, ovaler, triangular, or pentagonal shapes.

Referring to FIGS. 8A and 8B, the driving circuit layer 110 may have a hexagonal shape, which may be formed by cutting triangular shapes from two corners of a rectangular shape. In the hexagonal shape, the first sub-adhesive member 212 and the second sub-adhesive member 214 may be respectively provided in correspondence with the corners from which the triangular shapes have been cut.

Referring to FIGS. 9A and 9B, the driving circuit layer 110 may have a rectangular shape. Each of the first sub-adhesive member 212 and the second sub-adhesive member 214 may be respectively provided in correspondence with a vertex of the rectangular shape.

Although the positional relationship between the first sub-adhesive member 212 and the second sub-adhesive member 214, as well as the shape of each, have been illustrated in FIGS. 8A, 8B, 9A, and 9B, the inventive concept is not limited thereto. If the first sub-adhesive member 212 and the second sub-adhesive member 214 are provided at the step of the display member 100, the first sub-adhesive member 212 and the second sub-adhesive member 214 may have various positional relationships, and each of the first sub-adhesive member 212 and the second sub-adhesive member 214 may have various shapes.

The display device according to an embodiment may include the first adhesive layer provided at the step of the display member in which an adhesion area to the window and an adhesion area to the display member are the same. The first adhesive layer, in which the adhesion area to the window and the adhesion area to the display member are the same, may absorb an impact even if an external force is applied from any side of a window side or a display member side. Also, the display device according to an embodiment may improve a bonding force between components of the display device by including the first adhesive layer and the second adhesive layer, which may be spaced apart from the first adhesive layer and provided on the display layer, and by using a reduced amount of the adhesive layer. Accordingly, durability of the display device according to an embodiment may be improved.

Although the embodiments of the present invention have been described, it is understood that the present invention should not be limited to these embodiments but various changes and modifications can be made by one ordinary skilled in the art within the spirit and scope of the present invention as hereinafter claimed by the following claims and their equivalents. Accordingly, it is to be understood that the inventive concept has been described by way of illustration and not limitation.

What is claimed is:

1. A display device comprising:
    a driving circuit layer comprising a thin film transistor;
    a display layer at the driving circuit layer, and overlapping a portion of the driving circuit layer;
    a window at the display layer;
    a first adhesive member between the driving circuit layer and the window, and directly contacting the driving circuit layer and the window; and
    a second adhesive member between the display layer and the window, directly contacting the display layer and the window, and spaced from the first adhesive member in a plane view.

2. The display device of claim 1, wherein the first adhesive member comprises a double-sided adhesive tape.

3. The display device of claim 1, wherein the first adhesive member is thicker than the second adhesive member.

4. The display device of claim 1, wherein the first adhesive member is spaced from the display layer in a plane view.

5. The display device of claim 1, wherein the driving circuit layer further comprises:
    a first substrate portion in contact with the display layer;
    a second substrate portion connected to the first substrate portion; and
    a third substrate portion connected to the second substrate portion, and contacting the first adhesive member.

6. The display device of claim 5, wherein the second substrate portion is between the display layer and the first adhesive member in a plane view.

7. The display device of claim 5, further comprising:
    a printed circuit board electrically connected to the driving circuit layer; and
    a tape carrier package connected to each of the driving circuit layer and the printed circuit board.

8. The display device of claim 7, wherein the tape carrier package contacts the third substrate portion.

9. The display device of claim 7, wherein the tape carrier package is spaced from the first adhesive member.

10. The display device of claim 5, wherein the window comprises:
    a first window portion contacting the second adhesive member;
    a second window portion connected to the first window portion; and
    a third window portion connected to the second window portion, and contacting the first adhesive member.

11. The display device of claim 10, wherein the third substrate portion overlaps at least a portion of the third window portion.

12. The display device of claim 1, wherein the display layer comprises an organic electroluminescent device or a liquid crystal layer.

13. The display device of claim 12, wherein the display layer further comprises at least one of a touch screen panel or an optical member.

14. The display device of claim 1, wherein the first adhesive member comprises:
    a first adhesive layer;
    a resin layer at the first adhesive layer; and
    a second adhesive layer at the resin layer.

15. The display device of claim 1, wherein the first adhesive member comprises a first adhesive and an ultraviolet (UV) curing agent.

16. The display device of claim 15, wherein the first adhesive comprises at least one of acrylic acid, 2-ethylhexyl acrylate, 2-methylbutyl acrylate, isooctyl acrylate, lauryl acrylate, ethyl acrylate, butyl acrylate, hexyl acrylate, octyl acrylate, decyl acrylate, isodecyl acrylate, an acrylic acid monomer, or 2,2'-azobisisobutyronitrile.

17. The display device of claim 15, wherein the UV curing agent comprises at least one of aliphatic urethane acrylate, caprolactone acrylate, 1,6-hexanediol diacrylate, trimethylolpropane triacrylate, pentaerythritol triacrylate, lauryl acrylate, urethane acrylate, epoxy acrylate, polyester acrylate, or silicon acrylate.

18. The display device of claim 15, wherein the first adhesive member further comprises a photoinitiator.

19. The display device of claim 18, wherein the photoinitiator comprises at least one of benzoyl peroxide, acetyl peroxide, diauryl peroxide, hydrogen peroxide, potassium persulfonate, 2,2'-azobisisobutylnitrile, or hydroxy dimethyl acetophenone.

20. The display device of claim 1, wherein a surface area of the second adhesive member is equal to a surface area of the display layer.

* * * * *